(12) United States Patent
Kwon et al.

(10) Patent No.: US 8,865,251 B2
(45) Date of Patent: Oct. 21, 2014

(54) METAL NANOBELT AND METHOD OF MANUFACTURING THE SAME, AND CONDUCTIVE INK COMPOSITION AND CONDUCTIVE FILM COMPRISING THE SAME

(75) Inventors: Won-Jong Kwon, Daejeon (KR);
Jae-Hong Kim, Seoul (KR); Sun-Mi Jin, Daejeon (KR); Sang-Uck Lee, Daejeon (KR); Young-Soo Lim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 461 days.

(21) Appl. No.: 13/063,656

(22) PCT Filed: Sep. 10, 2009

(86) PCT No.: PCT/KR2009/005133
§ 371 (c)(1),
(2), (4) Date: Apr. 29, 2011

(87) PCT Pub. No.: WO2010/030123
PCT Pub. Date: Mar. 18, 2010

(65) Prior Publication Data
US 2012/0128996 A1 May 24, 2012

(30) Foreign Application Priority Data

Sep. 12, 2008 (KR) .......... 10-2008-0090376
Sep. 10, 2009 (KR) .......... 10-2009-0085338

(51) Int. Cl.
*H01B 1/02* (2006.01)
*B82Y 40/00* (2011.01)
(Continued)

(52) U.S. Cl.
CPC .......... *H01B 1/22* (2013.01); *H05K 1/092* (2013.01); *B82Y 30/00* (2013.01);
(Continued)

(58) Field of Classification Search
USPC .......... 252/500–518.1; 423/23, 445 R; 427/123, 125; 977/762, 810, 895, 900
See application file for complete search history.

(56) References Cited

U.S. PATENT DOCUMENTS 7,101,961 B2 9/2006 Wang et al.
2004/0013597 A1* 1/2004 Mao et al. .......... 423/447.1
(Continued)

FOREIGN PATENT DOCUMENTS

CN 1732549 2/2006
CN 1867626 A 11/2006
(Continued)

OTHER PUBLICATIONS

Sun et al. ("Uniform Silver Nanowires Synthesis by Reducing AgNO3 with Ethylene Glycol in the Presence of Seeds and Poly(Vinyl Pyrrolidone)." Chem. Mater., 14, p. 4736-4745, online pub Oct. 8, 2002).*

(Continued)

*Primary Examiner* — Tri V Nguyen
(74) *Attorney, Agent, or Firm* — McKenna Long & Aldridge LLP (57) ABSTRACT

The present invention relates to a metal nanobelt and a method of manufacturing the same, and a conductive ink composition and a conductive film including the same. The metal nanobelt can be easily manufactured at a normal temperature and pressure without requiring the application of high temperature and pressure, and also can be used to form a conductive film or conductive pattern that exhibits excellent conductivity if the conductive ink composition including the same is printed onto a substrate before a heat treatment or a drying process is carried out at low temperature. Therefore, the metal nanobelt and the conductive ink composition may be applied very appropriately for the formation of conductive patterns or conductive films for semiconductor devices, displays, solar cells in environments requiring low temperature heating. The metal nanobelt has a length of 500 nm or more, a length/width ratio of 10 or more, and a width/thickness ratio of 3 or more.

4 Claims, 7 Drawing Sheets

(51) Int. Cl.
*H05K 1/09* (2006.01)
*B82Y 30/00* (2011.01)
*H01B 1/22* (2006.01)
*H01L 31/0224* (2006.01)
*B82Y 10/00* (2011.01)
*B22F 9/24* (2006.01)
*H01B 1/24* (2006.01)
*B22F 1/00* (2006.01)

(52) U.S. Cl.
CPC ........... *Y02E 10/50* (2013.01); *H05K 2201/026* (2013.01); *B22F 2001/0033* (2013.01); *H01L 31/022433* (2013.01); *B22F 1/0018* (2013.01); *B82Y 10/00* (2013.01); *B22F 9/24* (2013.01); *H01B 1/24* (2013.01); *H05K 1/097* (2013.01); *Y10S 977/762* (2013.01); *Y10S 977/81* (2013.01); *Y10S 977/895* (2013.01); *Y10S 977/90* (2013.01)
USPC ........... 427/125; 252/502; 252/506; 252/510; 252/512; 252/518.1; 977/762; 977/810; 977/895; 977/900; 427/123; 423/23; 423/445 R (56) References Cited

U.S. PATENT DOCUMENTS

2009/0013824 A1* 1/2009 Kim et al. ................. 75/255
2011/0014550 A1* 1/2011 Jiang et al. ............... 429/528

FOREIGN PATENT DOCUMENTS

| | | |
|---|---|---|
| CN | 101010780 | 8/2007 |
| JP | 2004-161570 | 6/2004 |
| JP | 2004-182518 | 7/2007 |
| JP | 2007-528616 A | 10/2007 |
| JP | 2007-535413 A | 12/2007 |
| JP | 2008-156745 A | 7/2008 |
| KR | 10-2004-0101280 | 12/2004 |
| WO | WO 03/087707 | 10/2003 |
| WO | WO 2005/040265 A1 | 5/2005 |

OTHER PUBLICATIONS

Huczko ("Template-based synthesis of nanomaterials". Appl. PHys. A, 70, p. 365-376, online Mar. 8, 2000).*
Chen et al. ("One-Dimensional Nanostructures of Metals: Large-Scale Synthesis and Some Potential Applications." Langmuir, 23, p. 4120-4129, online Jan. 24, 2007).*
Bai et al. ("Polymer-Controlled Synthesis of Silver Nanobelts and Hierarchical Nanocolumns." Chem Mater, 19, p. 3367-3369, Web pub Jun. 15, 2007).*
Krutyakov et al. ("Synthesis and properties of silver nanoparticles: advances and prospects." Russ Chem Rev, 77(3), p. 233-257, 2008).*
Cao et al. ("Template-based synthesis of nanorod, nanowire, and nanotube arrays." Adv in Coll and Interface Sc, 136, p. 45-64, Online Jul. 26, 2007).*
Xu et al. ("Solution Route to Inorganic Nanobelt-Conducting Organic Polymer Core-Shell Nanocomposites." J. Polym Sci Part A, 43, p. 2892-2900, 2005).*
Sun et al. ("Transformation of Silver Nanospheres into Nanobelts and Triangular Nanoplates through a Thermal Process." Nano Letters, 3(5), pp. 675-679, 2003).*
Lee, N.S., et al., "Application of carbon nanotubes to field emission displays," Diamond and Related Materials 10 (2001) 265-270.

* cited by examiner

METAL NANOBELT AND METHOD OF MANUFACTURING THE SAME, AND CONDUCTIVE INK COMPOSITION AND CONDUCTIVE FILM COMPRISING THE SAME

This application is a National Stage Entry of International Application No. PCT/KR2009/005133, filed Sep. 10, 2009, and claims the benefit of Korean Patent Application Nos. 10-2008-0090376 filed on Sep. 12, 2008, and 10-2009-0085338 filed on Sep. 10, 2009, all of which are hereby incorporated by reference in their entirety for all purposes as if fully set forth herein.

BACKGROUND OF THE INVENTION (a) Field of the Invention

The present invention relates to a metal nanobelt, a method for manufacturing the same, and a conductive ink composition and a conductive film comprising the same.

(b) Description of the Related Art

Various conductive elements such as an electrode, wirings or an electromagnetic shielding film are included in semiconductor devices, display devices such as PDP or LCD, or a solar cell and the like. One of the mostly used methods for forming the conductive elements is printing a conductive fine particles, for example, a conductive ink composition comprising conductive nanoparticles and an solvent on a substrate, and then, heat treating (for example, firing and drying) to form a conductive pattern or a conductive film which forms various conductive elements on the substrate.

However, to form a conductive film or a conductive pattern using so far developed conductive nanoparticles, a process is required wherein a conductive ink composition comprising the same is printed onto a substrate, and then, fired at high temperature to remove an organic substance (for example, an organic solvent) included in the conductive ink composition and reduce or melting-connect the conductive nanoparticles. This process is to reduce the conductive nanoparticles included in the conductive ink composition or melting-connect the conductive nanoparticles to obtain uniform conductive pattern or conductive film exhibiting excellent conductivity.

However, the kinds of substrates capable of forming a conductive film or conductive pattern are limited due to the necessity of the high temperature firing process. For this reason, there has been continuous demand for a conductive nanoparticle or a conductive ink composition which may form a conductive pattern and the like having excellent conductivity even if a firing process or a heat treatment is applied at lower temperature.

Accordingly, various conductive nanoparticles or conductive ink compositions for low temperature firing have been suggested, but there is a limit in that the firing temperature may not be sufficiently lowered or sufficient conductivity may not be obtained.

SUMMARY OF THE INVENTION

The present invention provides a metal nanobelt capable of forming a conductive pattern or a conductive film that exhibits excellent conductivity even under an environment requiring low temperature heating.

Further, the present invention provides a method for manufacturing a metal nanobelt that may prepare the metal nanobelt by a simplified process.

The present invention also provides a conductive ink composition comprising the metal nanobelt, and capable of forming a conductive pattern or a conductive film that exhibits excellent conductivity if the conductive ink composition is printed onto a substrate before a heat treatment or a drying process is carried out at low temperature.

Further, the present invention provides a conductive film comprising the metal nanobelt.

Accordingly, the present invention provides a metal nanobelt having a length of 500 nm or more, a length/width ratio of 10 or more, and a width/thickness ratio of 3 or more. The metal nanobelt may have a length of 1 μm~2000 μm, a width of 100 nm~100 μm and a thickness of 15~500 nm.

The present invention also provides a method for manufacturing a metal nanobelt comprising reacting a carbon nanotube, a conductive polymer, and a metal salt.

The present invention also provides a conductive ink composition comprising the metal nanobelt and a solvent.

The present invention also provides a conductive film comprising the metal nanobelt.

DETAILED DESCRIPTION OF THE EMBODIMENTS

Hereinafter, a metal nanobelt, a method for manufacturing the same, and a conductive ink composition and a conductive film comprising the same according to specific embodiments will be explained.

Some terms used herein are defined as follows, unless otherwise indicated.

The term "a metal nanobelt" refers to a nanostructure that comprises metal, and has a long connected shape such as a belt in one direction. The average straight-line distance from the one end to the opposite end of "the metal nanobelt" connected lengthwise in a belt shape is defined as "a length", and the average straight-line distance from the one end to the opposite end of the "metal nanobelt" in a vertical direction to the "length" direction on the plane is defined as a "width". And, the average straight-line distance between the upper and the lower sides of the metal nanobelt having a belt shape in a vertical direction to the plane made by the "length" direction and the "width" direction is defined as a "thickness". The metal nanobelt may have at least one nano scale size of length, width or thickness (for example, thickness), and have several times larger length than width, and several times larger width than thickness, and thus, it may have a belt shape wherein rectangles or similar polygons having thin thickness are connected lengthwise.

And, the description that the metal nanobelt "does not substantially comprise a metal oxide" means that the "metal" comprised in the metal nanobelt exists in a non-oxidized state and the metal nanobelt does not comprise a metal oxide at all, or that a small amount of metal, for example less than 1 wt % or less than 0.1 wt % based on the metal nanobelt is oxidized during the manufacturing process or the application process, and the metal nanobelt comprises only a small amount of metal oxide corresponding thereto.

And, the description that the metal nanobelt comprises a single metal, for example "only silver (Ag)" means that it comprises one kind of a metal ingredient, for example a single metal ingredient of "silver (Ag)", and it does not comprise other kinds of metal ingredients. However, the description comprising "silver (Ag)" instead of "only silver (Ag)" may be defined as not limiting the addition of other metal ingredients.

And, the term "a conductive ink composition" refers to any composition that can be printed or coated on a substrate formed of polymer, glass or metal, etc. to form a conductive layer, film or pattern, regardless whether it is of a "paste" state with relatively high viscosity or has a low viscosity such as water.

And, the term "a conductive film" refers to any layer, film or pattern that is formed on a substrate made of polymer, glass or metal, etc. to exhibit thermal or electrical conductivity.

And, the description that any part "comprises", "contains" or "has" a certain constitutional element means that any other constitutional elements may be added without limitation, unless otherwise indicated.

Meanwhile, according to one embodiment of the invention, a metal nanobelt having a length of 500 nm or more, a length/width ratio of 10 or more, a width/thickness ratio of 3 or more is provided. The metal nanobelt may have a length of 1 μm~2000 μm, preferably 2~1000 μm, more preferably 2~10 μm. And, the metal nanobelt may have a width of 100 nm~100 μm, preferably 100 nm~10 μm, more preferably 100 nm~2 μm. And, the metal nanobelt may have a thickness of 15~500 nm, preferably 20~300 nm, more preferably 20~250 nm.

And, the metal nanobelt may have a length/width ratio of 10 to 20000, preferably 10 to 1000, more preferably 10 to 200. And, the metal nanobelt may have a width/thickness ratio of 3 to 6000, preferably 3 to 500, more preferably 3 to 50.

As the results of studies of the inventors, it was surprisingly found that a nanostructure of a belt shape having a nano scale thickness appropriate for a conductive nanostructure, a somewhat wide width, and a length of minimum 500 nm to 100 μm or more, maximum 2000 μm, i.e., the metal nanobelt of the present invention may be obtained by a method of reacting a carbon nanotube, a conductive polymer and a metal salt together. The metal nanobelt is connected with longer length than the existing conductive nanostructure or conductive nanoparticle, and it has a belt shape due to its somewhat wide width. And, since the metal nanobelt may be manufactured by the reaction process at a room temperature and an atmospheric pressure, it does not substantially comprise a metal oxide and it may be formed of only a single metal ingredient such as silver (Ag), which will be explained in detail below.

Specifically, according to one embodiment of the invention, a metal nanobelt wherein fine metal particles having at least nano scale thickness are connected with wide width and sufficiently long length may be obtained, and it may not substantially comprise a metal oxide. Therefore, if a conductive ink composition comprising the metal nanobelt is printed onto a substrate, the conductive film such as a conductive layer or a conductive pattern formed therefrom may exhibit sufficiently excellent conductivity without need to progress a high temperature heating process that has been applied for reducing or melting connecting conductive nanoparticles. And, the metal nanobelt may comprise only a single metal ingredient such as silver (Ag). Therefore, the metal nanobelt may be formed of a single metal ingredient such as silver (Ag) having lower resistance so that a conductive film formed therefrom may exhibit more excellent conductivity.

Therefore, the metal nanobelt may be very preferably used for a conductive ink composition for the formation of a conductive layer or conductive pattern of various semiconductor devices, display devices or solar cells, etc. particularly under an environment requiring a low temperature heating.

Meanwhile, since the metal nanobelt is formed by the reaction of the metal salt, carbon nanotube and conductive polymer, fine metal particles may be connected through the conductive polymer or carbon nanotube so that the metal nanobelt may have a long connected belt shape with a wide width. Particularly, the metal nanobelt may further comprise a carbon nanotube that is discontinuously included in the belt shape while forming the backbone of the belt shape. Specifically, since the metal nanobelt may have a belt shape while the carbon nanotube connects the metal particles to form the backbone, it may not substantially comprise a metal oxide and form a belt shape with wide width and long length. Therefore, as explained above, if a conductive ink composition comprising the metal nanobelt is printed, a conductive film such as a conductive layer or a conductive pattern formed therefrom may exhibit uniform and excellent conductivity without need to progress a high temperature heating process that has been progressed for reducing or melting connecting conductive nanoparticles.

And, the metal nanobelt may not substantially comprise a metal oxide. The meaning of the description "not substantially comprise a metal oxide" is as explained above. As will be explained below, since the metal nanobelt may be formed by the reaction of a metal salt, a carbon nanotube and a conductive polymer at room temperature and atmospheric pressure, oxidation of metal that has been be caused by a high temperature reaction process for preparing conductive nanoparticles may be minimized and thus the metal nanobelt may not substantially comprise a metal oxide. Thereby, even if a high temperature heating process that has been progressed for reducing conductive nanoparticles included in a conductive ink composition after printing the conductive ink composition is not separately progressed, a conductive film formed therefrom may exhibit excellent conductivity.

And, the metal nanobelt may comprise any metal or alloy having excellent conductivity, for example, silver (Ag). Thereby, the metal nanobelt and various conductive patterns or conductive layers formed from a conductive ink composition comprising the same may exhibit more excellent conductivity.

Particularly, since the metal nanobelt may have a belt shape while carbon nanotube and the like form a backbone, it may be consisted only of silver (Ag). Specifically, since the metal nanobelt of a belt shape is formed while the carbon nanotube and the like form a backbone, it is not required that 2 or more kinds of metal ingredients should be included and at least one kind of metal ingredient should form a backbone of the belt shape or basic template, and the metal nanobelt may be consisted only of a single metal ingredient showing low resistance such as silver (Ag) so that the metal nanobelt and a conductive film formed therefrom may exhibit more excellent conductivity.

The metal nanobelt may form a conductive film such as a conductive pattern or a conductive layer exhibiting excellent conductivity even if a high temperature heating process is not applied after a conductive ink composition comprising the metal nanobelt is printed onto a substrate consisting of polymer, glass or metal and the like. Particularly, the metal nanobelt and the conductive ink composition comprising the same may be applied to any substrate made of any material to form various conductive patterns or conductive layers without need to progress a high temperature heating process. Therefore, the metal nanobelt may be very preferably applied for an ink composition for the formation of various conductive films included in display devices such as PDP or LCD and the like, semiconductor devices or solar cells, for example, a conductive layer or a conductive pattern of an electrode, wirings or an electromagnetic shielding film and the like. For example, the metal nanobelt may be applied for forming a transparent conductive film such as a transparent conductive layer that is printed onto a transparent substrate and included in a touch panel, may be applied for forming an electrode or wiring patterns of a semiconductor substrate, or may be applied for forming wiring patterns, an electrode or an electromagnetic shielding filter and the like of various display devices. And, since the metal nanobelt may exhibit excellent thermal conductivity, it may also be applied for forming various thermally conductive films. Particularly, the metal nanobelt may be more preferably applied under an environment requiring low temperature heating.

Meanwhile, according to another embodiment of the invention, a method for manufacturing the above explained nanobelt is provided. The method for manufacturing the metal nanobelt comprises reacting a carbon nanotube, a conductive polymer and a metal salt.

As will be supported by the following examples, a metal nanobelt wherein fine metal particles are connected lengthwise in a belt shape with a wide width through the conductive polymer and carbon nanotube to exhibit the above explained properties may be prepared by the above reaction process, without progressing a reaction at high temperature and high pressure. Particularly, since the reaction process does not require high temperature high pressure reaction conditions and progresses a single-step reaction, the manufacturing process of the metal nanobelt may be simplified, and oxidation of metal caused by a high temperature high pressure reaction may be inhibited to enable manufacturing of a metal nanobelt that does not substantially comprise a metal oxide The method for manufacturing a metal nanobelt may comprise forming a first dispersion comprising a carbon nanotube, forming a second dispersion comprising a conductive polymer, and mixing the first and the second dispersions and reacting them with a metal salt, and the reaction may be effectively progressed even at room temperature and atmospheric pressure. For example, the reaction may be conducted at 1 to 100° C. and 1 to 2 atm for 1 to 50 hours, and thereby, a metal nanobelt according to one embodiment of the invention having the above explained properties may be effectively prepared.

The conductive polymer may include any known conductive polymers, for example, polypyrrole, polyaniline, polythiophene or a copolymer thereof. And, the metal salt may include any salt of metal exhibiting conductivity, commonly used for a precursor for forming conductive nanoparticles without specific limitation. For examples, the metal salt may be silver (Ag), specifically, silver sulfate ($Ag_2SO_4$), silver acetate ($Ag(CH_3COO)$), silver halide such as silver fluoride (AgF), silver chloride (AgCl), silver bromide (AgBr), or silver iodide (AgI), silver cyanide (AgCN), silver cyanate (AgOCN), silver lactate ($Ag(CH_3CHOHCOO)$), silver carbonate ($Ag_2CO_3$), silver perchlorate ($AgClO_4$), silver trifluoroacetate ($Ag(CF_3COO)$), or silver trifluoromethanesulfonate ($Ag(CF_3SO_3)$) and the like. In addition to the above exemplified conductive polymer or metal salt, any conductive polymer or various salts of metals exhibiting conductivity may be used.

And, the carbon nanotube may include any carbon nanotube such as single walled carbon nanotube or multi walled carbon nanotube and the like, without specific limitation. For example, the single walled carbon nanotube may be more preferably used in terms of conductivity of the metal nanobelt to be prepared, and the multi walled carbon nanotube may be more preferably used in terms of mechanical properties of the metal nanobelt to be prepared.

And, the reaction of the metal salt, carbon nanotube and conductive polymer may be conducted in a solvent selected from water, alcohol, acetone, methylethylketone (MEK), ethylene glycol, formamide (HCOOH), dimethylformamide (DMF), dimethylacetamide (DMAc), dimethylsulfoxide (DMSO), N-methylpyrrolidone (NMP), or a mixed solvent thereof. For example, the carbon nanotube may be dispersed in water to form a first dispersion comprising the carbon nanotube, the conductive polymer may be dispersed in alcohol to form a second dispersion, and then, the metal salt may be added to the mixture of the first and second dispersions to react them. In the reaction process, the adding sequence of each reactant, a dispersion forming method, or the mixing sequence and the like may be easily modified by one of ordinary knowledge in the art.

Meanwhile, according to yet another embodiment of the invention, a conductive ink composition comprising the above described metal nanobelt and a solvent is provided. The conductive ink composition may not substantially comprise a metal oxide, and may be consisted of a single low resistance metal ingredient such as silver (Ag), and it comprises the above explained metal nanobelt of a belt shape wherein fine metal particles with nano scale size (thickness) are connected lengthwise with wide width. Therefore, if the ink composition is printed onto a substrate, a conductive film such as a conductive layer or a conductive pattern exhibiting excellent conductivity may be formed without progressing a high temperature heating process that has been progressed for reducing or melting connecting conductive nanoparticles.

Specifically, if the conductive ink composition is printed or coated on a substrate before a heat treatment or drying is conducted at low temperature for removing the solvent, a conductive film such as a conductive layer or a conductive pattern including a plurality of nanobelts which do not substantially comprise a metal oxide and has a shape wherein metal layers of nanoscale thickness are connected lengthwise with wide width may be formed, and thus the conductive film may exhibit very excellent conductivity.

Therefore, the conductive ink composition may be preferably applied for forming various conductive films such as a conductive layer or a conductive pattern of an electrode, wirings or an electromagnetic shielding film included in display devices such as PDP or LCD, semiconductor devices or a solar cell, or a thermally conductive film. For example, the conductive ink composition may be printed onto a transparent substrate to form a transparent conductive layer included in a touch panel, or it may be applied for forming a wiring pattern or an electrode of a semiconductor substrate, or it may be applied for forming a wiring pattern, an electrode, or an electromagnetic shielding filter of display devices. Particularly, the conductive ink composition may be more preferably applied under an environment requiring low temperature heating, and it may overcome limitation of the kinds of applicable substrates because high temperature heating is not required.

Meanwhile, the conductive ink composition may further comprise a carbon nanotube besides the metal nanobelt and a solvent, and if necessary, it may further comprise any ingredients commonly used in a conductive ink composition such as a dispersant, a binder, or a pigment and the like.

And, the solvent may include any solvents commonly used in a conductive ink composition, and specific examples thereof may include an alcohol based solvent such as ethanol, an alcohol alkyl ether based solvent, an alcohol aryl ether based solvent, an ester based solvent, an amide based solvent, an amine based solvent, an aromatic hydrocarbon based solvent, an aromatic hydrocarbon based solvent, and a combination thereof.

And, the conductive ink composition may comprise the metal nanobelt in the contents of 0.1 to 30 wt %, based on the total weight of the composition. Thereby, dispersability of the metal nanobelt in the conductive ink composition may become good, and a solvent may be easily removed later to form a conductive layer or a conductive pattern.

Meanwhile, according to yet another embodiment of the invention, a conductive film, for example, a conductive layer or a conductive pattern, comprising the metal nanobelt is provided. The conductive film may exhibit excellent conductivity, and simultaneously does not require a high temperature heating process in its formation process, and thus, it may overcome technical limitation such as limitation of applicable substrates, and it may be applied for more various substrates and electronic, electrical devices.

The conductive film may be formed by printing or coating the above described conductive ink composition on a substrate, and then, drying or heat treating it at a low temperature of for example 50 to 200° C. to remove a solvent included in the conductive ink composition.

In the conductive film, the metal nanobelts, for example, silver nanobelts are connected with each other to form a conductive channel. In the conductive channel, it is likely that the wide sides of the metal nanobelts contact each other, the narrow sides contact each other, or the wide side and the narrow side contact each other at the contact point of the metal nanobelts. However, since the metal nanobelt has a wide width and shear is applied when coating the conductive film, the metal nanobelt is likely to be distributed in a shape that the wide side lies down on the ground, and it is more likely that the wide sides of the metal nanobelts contact and are connected. On the other hand, in case a conductive film is formed from an ink composition comprising a nanostructure of another shape such as nanowire, it is more likely that narrow lines or points contact at the contact point of the nanostructures, and thus, resistance of a conductive channel may become higher and conductivity may become comparatively lower. To the contrary, in the conductive film according to another embodiment of the invention, it is more likely that wide sides contact at the contact point of the metal nanobelts, thus exhibiting more excellent conductivity.

Therefore, the conductive film may be a conductive layer or a conductive pattern of an electrode, wirings, or an electromagnetic shielding film included in display devices, semiconductor devices, or a solar cell, or it may be a transparent conductive film such as a transparent conductive layer that is formed on a transparent substrate and included in a touch panel and the like.

Particularly, since a touch panel, a solar cell, a display device or a semiconductor device to which the conductive film is applied comprises a conductive element that is formed without high temperature heating and yet exhibit excellent conductivity, it may overcome technical limitations such as limitation in the applicable substrates, and exhibit excellent properties.

Meanwhile, the touch panel, solar cell, display device or semiconductor device may be manufactured by a common process, except including a conductive film formed from the above explained conductive ink composition.

Hereinafter, the present invention will be explained in detail with reference to the following Examples. However, these Examples are only to illustrate the invention, and the scope of the invention is not limited thereto.

A. Preparation of a Reagent

Reagents used for the preparation of the after-mentioned silver nanobelt are as follows, and they were used as purchased without specific purification.

aniline hydrochloride (Aldrich, 97%), 2-aminobenzoic acid (Aldrich, 99%), 2-aminophenol (Aldrich, 97%), 1,3-phenylenediamine (Aldrich, 99+%), ammonium persulfate (Acros, 98%), HCl (Duksan), $HNO_3$ (Duksan), $AgNO_3$ (Acros, 99%)

As a multi walled carbon nanotube (MWNT), a product from Nanocyl (Nanocyl-7000) having average diameter of 10 nm and purity of 90%, which is produced by CCVD and does not passes purification process was used. 2 g of the MWNT was introduced in a flask, 100 ml of conc. nitric acid was added, and then, the mixture was refluxed for 4 hours, and cooled to room temperature and filtered to separate a carbon nanotube (CNT). The mixture was washed with distilled water until the pH becomes neutral, and then, dried at room temperature and used for manufacturing of a silver nanobelt.

B. Synthesis of Conductive Polymer

Synthesis Example 1

Synthesis of PANi(polyaniline)-acid (Emeraldine Salt)

5.18 g of aniline hydrochloride was dissolved in 250 ml of a 0.2 M hydrochloric acid solution in a 1 L flask, and 14.26 g of ammonium persulfate dissolved in 250 ml of a 0.2 M hydrochloric acid solution was added dropwise to the aniline solution with stirring. The mixture was polymerized at room temperature for 3~4 hours, and then, centrifuged, washed with a 0.2 M hydrochloride solution twice and acetone once, and dried at room temperature to obtain 4.5 g of deep blue green powder. The obtained PANi-acid is represented by the following Chemical Formula a).

a) PANi-acid

Synthesis Example 2

Synthesis of PANi-base (Emeraldine Base)

The PANi-acid obtained in the Synthesis Example 1 was reacted in a 0.5 M NaOH solution overnight, and then, centrifuged, washed with distilled water and acetone, and dried at room temperature to obtain 3.6 g of indigo powder. The obtained PANi-base is represented by the following Chemical Formula b).

b) PANi-base

Synthesis Example 3

Synthesis of $P[Ani]_{0.8}[Anthranilic\ acid]_{0.2}$ 4.92 g of $P[Ani]_{0.8}[Anthranilic\ acid]_{0.2}$ was obtained substantially by the same method as the Synthesis Example 1, except using 5.18 g of aniline hydrochloride and 1.37 g of anthranilic acid instead of 5.18 g of aniline hydrochloride. The obtained $P[Ani]_{0.8}[Anthranilic\ acid]_{0.2}$ is represented by the following Chemical Formula c).

c) P[Ani][anthranilic acid]

Synthesis Example 4

Synthesis of $P[Ani]_{0.5}[Anthranilic\ acid]_{0.5}$ 3.23 g of $P[Ani]_{0.5}[Anthranilic\ acid]_{0.5}$ was obtained substantially by the same method as the Synthesis Example 3, except using 3.24 g of aniline hydrochloride and 3.43 g of anthranilic acid. The obtained $P[Ani]_{0.5}[Anthranilic\ acid]_{0.5}$ is represented by the following Chemical Formula c).

c) P[Ani][anthranilic acid]

Synthesis Example 5

Synthesis of P[Ani]$_{0.8}$[Anthranilic acid]$_{0.8}$ 4.62 g of P[Ani]$_{0.2}$[Anthranilic acid]$_{0.8}$ was obtained substantially by the same method as the Synthesis Example 3, except using 1.30 g of aniline hydrochloride and 5.49 g of anthranilic acid. The obtained P[Ani]$_{0.2}$[Anthranilic acid]$_{0.8}$ is represented by the following Chemical Formula c).

c) P[Ani][anthranilic acid]

Synthesis Example 6

Synthesis of P[Ani]$_{0.5}$[1,3-phenylenediamine]$_{0.5}$ 3.25 g of P[Ani]$_{0.5}$[1,3-phenylenediamine]$_{0.5}$ was obtained substantially by the same method as the Synthesis Example 1, except using 3.24 g of aniline hydrochloride and 2.71 g of 1,3-phenylenediamine instead of 5.18 g of aniline hydrochloride. The obtained P[Ani]$_{0.5}$[1,3-phenylenediamine]$_{0.5}$ is represented by the following Chemical Formula d).

d) P[Ani][1,3-phenylenediamine]

Synthesis Example 7

Synthesis of P[Ani]$_{0.5}$[2-aminophenol]$_{0.5}$ 3.34 g of [Ani]$_{0.5}$[2-aminophenol]$_{0.5}$ was obtained substantially by the same method as the Synthesis Example 1, except using 3.24 g of aniline hydrochloride and 2.73 g of 2-aminophenol instead of 5.18 g of aniline hydrochloride. The obtained P[Ani]$_{0.5}$[2-aminophenol]$_{0.5}$ is represented by the following Chemical Formula e).

e) P[Ani][2-aminophenol]

C. Synthesis of Silver (Ag) Nanobelt

Example 1

Synthesis of Silver (Ag) Nanobelt 100 mg of multi walled carbon nanotube (MWNT) and 400 ml of distilled water were mixed, and ultrasonicated to form a MWNT dispersion. 75 mg of the polyaniline (PANi-acid) powder obtained in the Synthesis Example 1 and 200 ml of ethanol were mixed, and ultrasonicated to form a polyaniline (PANi) dispersion. 30 ml of the MWNT dispersion and 200 ml of the PANi dispersion were mixed, 35 mg of silver nitrate ($AgNO_3$) was added to prepare a mixed solution, and the solution was allowed to stand at 25° C. and 1 atm for 48 hours to progress a reaction.

And then, the solid (a mixture of MWNT and silver nanobelt) and the liquid (conductive polymer and unreacted silver nitrate aqueous solution) were separated by centrifugation. 50 ml of distilled water was added to the solid and the mixture was allowed to stand for 6 hours, and then, only the silver nanobelt got tangled and floated to the surface of the water, and MWNT was settled. Only the silver nanobelt floated to the surface of the water was recovered and dried to obtain 11 mg of purified silver nanobelt.

Figure 1:
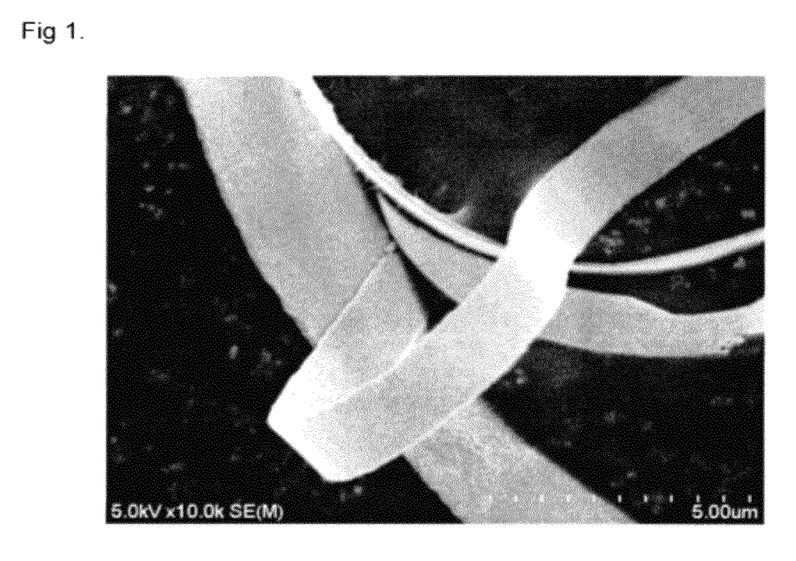
FIGS. 1 and 2 shows an SEM image of the silver nanobelt obtained in Example 1.
Figure 2:
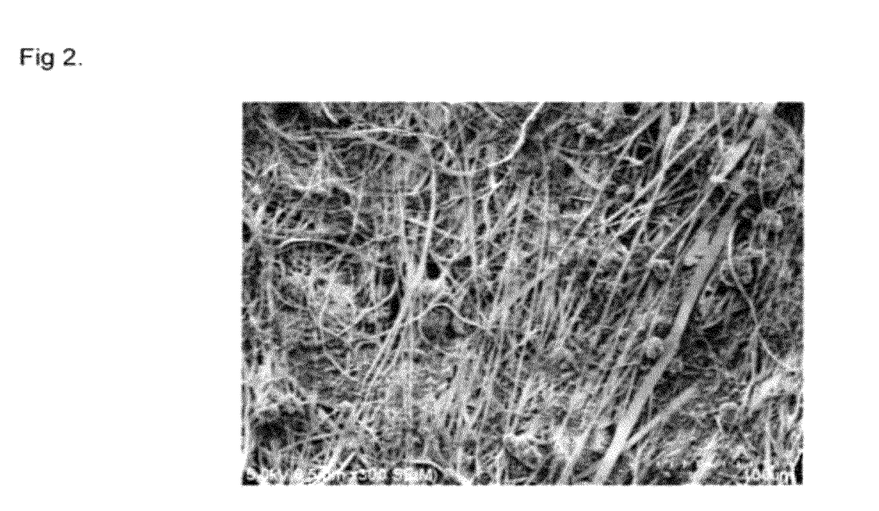
Figure 3:
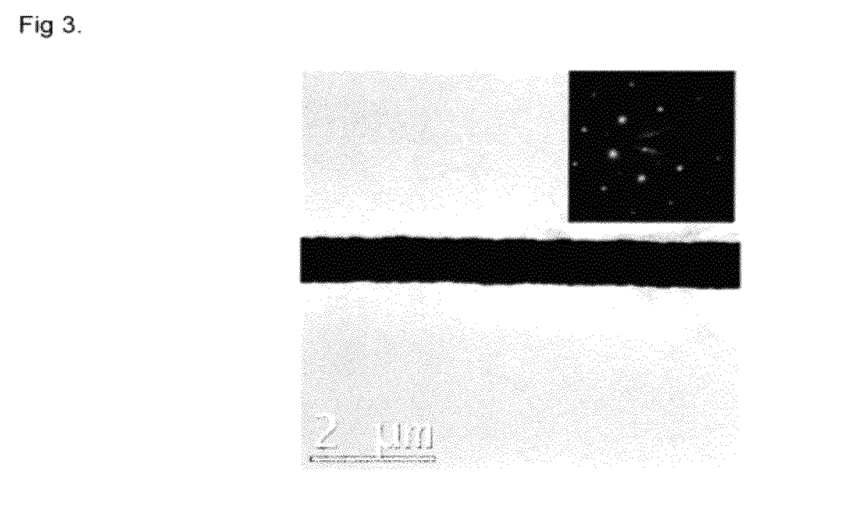
FIG. 3 shows a TEM image and X-ray diffraction pattern (small picture at the right upper part) of the silver nanobelt obtained in Example 1.
Figure 4:
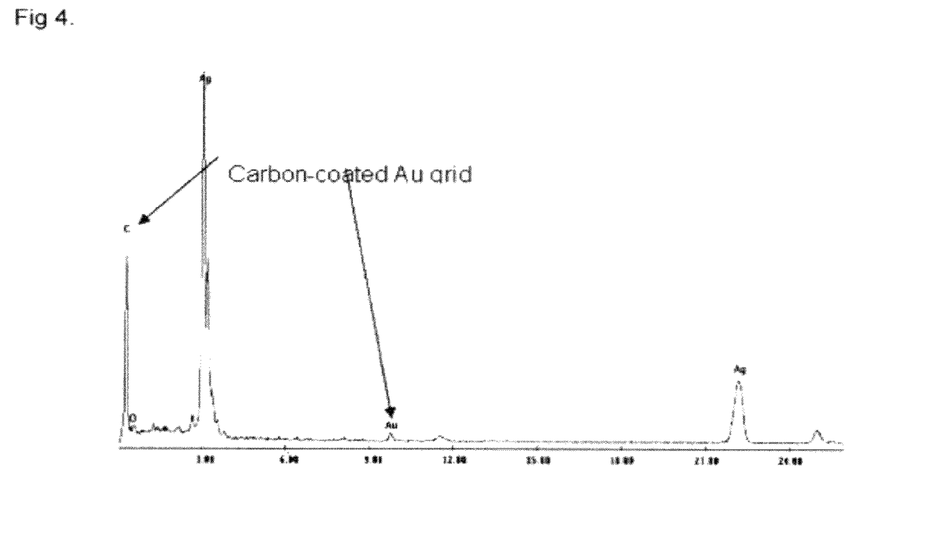
FIG. 4 shows an EDX spectrum of the silver nanobelt obtained in Example 1.

SEM images of the silver nanobelt obtained in Example 1 are shown in FIGS. 1 *and* 2, and TEM image and X-ray diffraction pattern (picture at the right upper part) are shown in FIG. 3. EDX spectrum of the silver nanobelt is shown in FIG. 4.

As the result of measuring the size of the obtained silver nanobelt using SEM, it is confirmed that the silver nanobelt has a belt shape with a length of 500~2000 μm, a width of 10~20 μm, and a thickness of 200~500 nm (the length/width ratio is 10 or more, the width/thickness ratio is 3 or more). As shown in FIGS. 3 and 4, it is also confirmed that the silver nanobelt obtained in Example 1 does not substantially comprise silver oxide, and it is only consisted of non-oxidized silver (Ag). And, it is also confirmed by the TEM image and X-ray diffraction pattern that a carbon nanotube is comprised in the silver nanobelt to form a backbone of the belt shape made by the silver nanobelt.

Example 2

Figure 5:
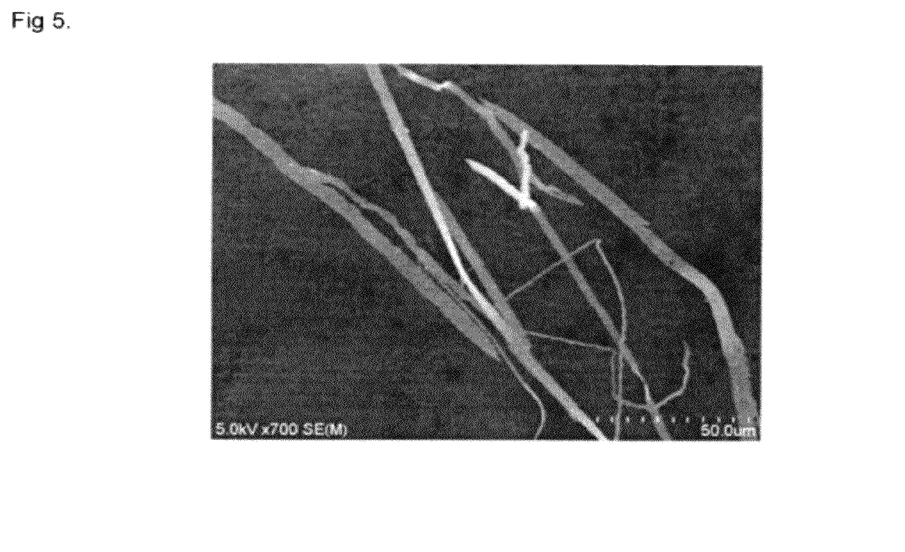
FIG. 5 shows an SEM image of the silver nanobelt obtained in Example 2.

Synthesis of Silver (Ag) Nanobelt 5 mg of silver nanobelt was obtained by the same method as Example 1, using the PANi-base prepared in the Synthesis Example 2. SEM image of the obtained silver nanobelt is shown in FIG. 5. It is confirmed that the silver nanobelt has a belt shape with a length of 600~2000 μm, a width of 3~10 μm, and a thickness of 100~300 nm (the length/width ratio is 10 or more, and the width/thickness ratio is 3 or more).

Example 3

Figure 6:
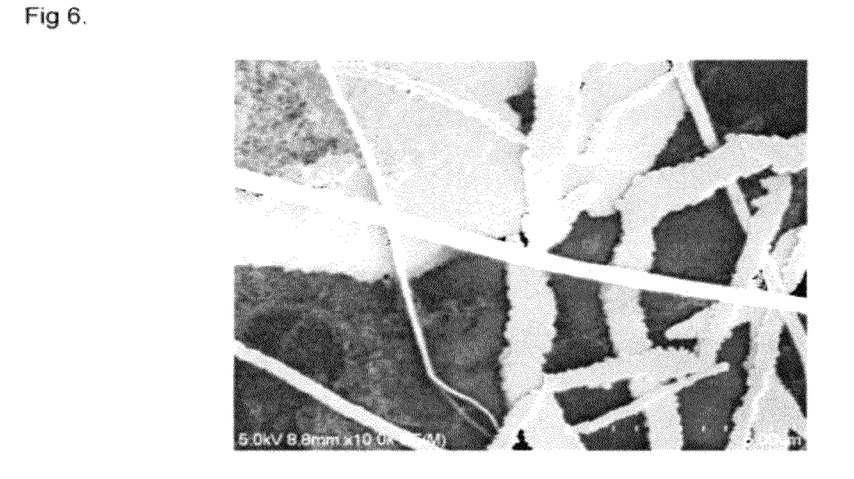
FIG. 6 shows an SEM image of the silver nanobelt obtained in Example 3.

Synthesis of Silver (Ag) Nanobelt 6 mg of silver nanobelt was obtained by the same method as Example 1, using the $P[Ani]_{0.8}[Anthranilic\ acid]_{0.2}$ prepared in the Synthesis Example 3. SEM image of the obtained silver nanobelt is shown in FIG. 6. It is confirmed that the silver nanobelt has a belt shape with a length of 60~200 μm, a width of 0.4~0.8 μm, and a thickness of 100~200 nm (the length/width ratio is 10 or more, and the width/thickness ratio is 3 or more).

Example 4

Figure 7:
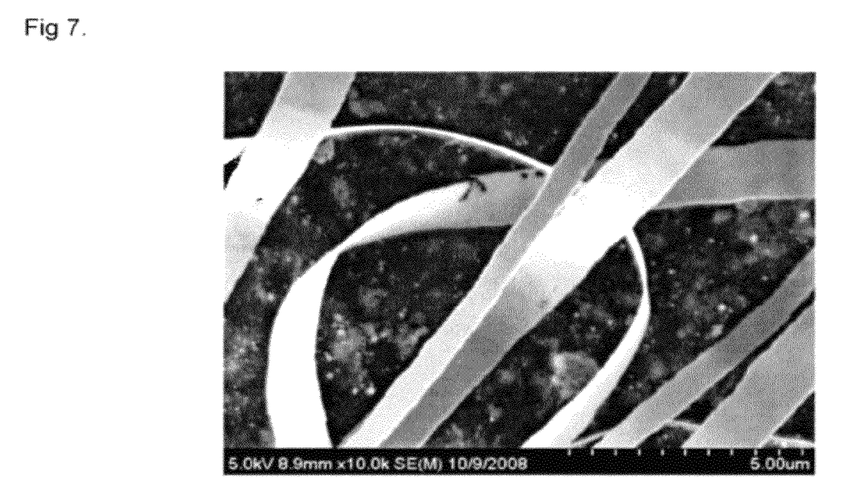
FIG. 7 shows an SEM image of the silver nanobelt obtained in Example 4.

Synthesis of Silver (Ag) Nanobelt 4 mg of silver nanobelt was obtained by the same method as Example 1, using the $P[Ani]_{0.5}[Anthranilic\ acid]_{0.5}$ prepared in the Synthesis Example 4. SEM image of the obtained silver nanobelt is shown in FIG. 7. It is confirmed that the silver nanobelt has a belt shape with a length of 300~1000 μm, a width of 0.8~1.5 μm, and a thickness of 100~200 nm (the length/width ratio is 10 or more, and the width/thickness ratio is 3 or more).

Example 5

Figure 8:
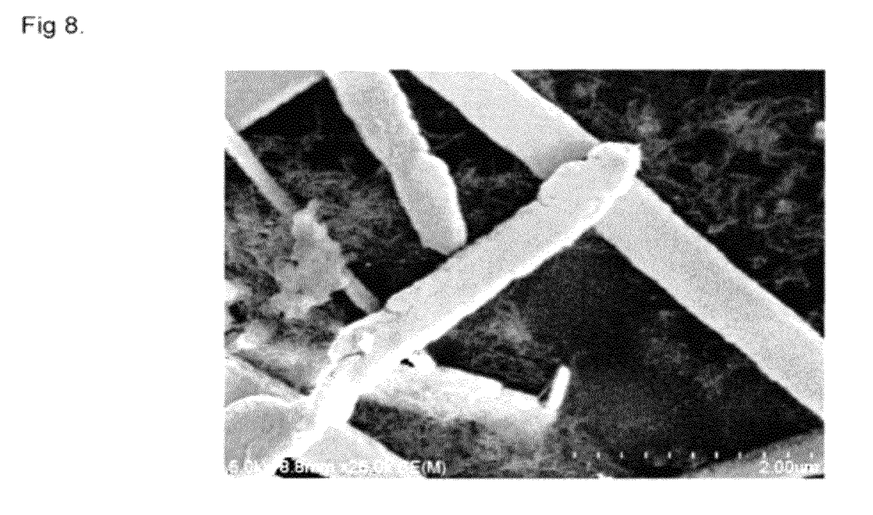
FIG. 8 shows an SEM image of the silver nanobelt obtained in Example 5.

Synthesis of Silver (Ag) Nanobelt 2.7 mg of silver nanobelt was obtained by the same method as Example 1, using the $P[Ani]_{0.2}[Anthranilic\ acid]_{0.8}$ prepared in the Synthesis Example 5. SEM image of the obtained silver nanobelt is shown in FIG. 8. It is confirmed that the silver nanobelt has a belt shape with a length of 100~500 μm, a width of 0.1~0.3 μm, and a thickness of 30~80 nm (the length/width ratio is 10 or more, and the width/thickness ratio is 3 or more).

Example 6

Figure 9:
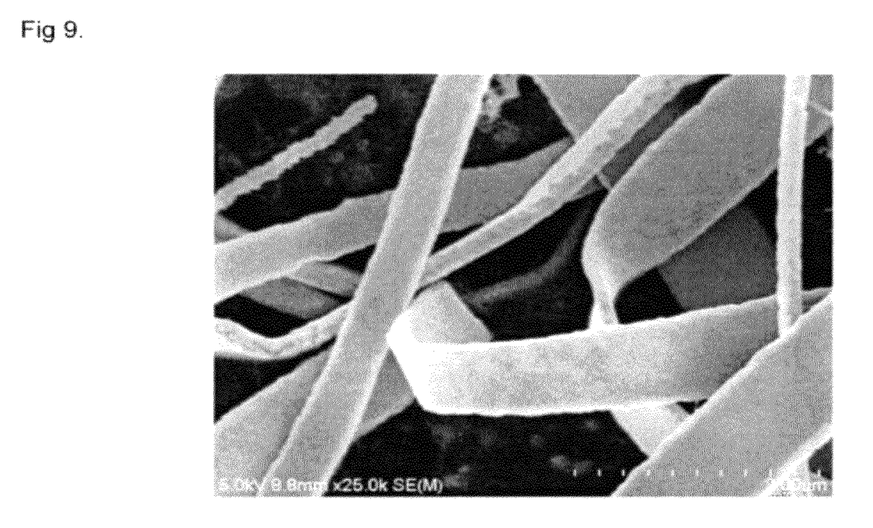
FIG. 9 shows an SEM image of the silver nanobelt obtained in Example 6.

Synthesis of Silver (Ag) Nanobelt 1.4 mg of silver nanobelt was obtained by the same method as Example 1, using the $P[Ani]_{0.5}[1,3\text{-phenylenediamine}]_{0.5}$ prepared in the Synthesis Example 6. SEM image of the obtained silver nanobelt is shown in FIG. 9. It is confirmed that the silver nanobelt has a belt shape with a length of 100~300 μm, a width of 0.5~2 μm, and a thickness of 50~150 nm (provided that the length/width ratio is 10 or more, and the width/thickness ratio is 3 or more).

Example 7

Figure 10:
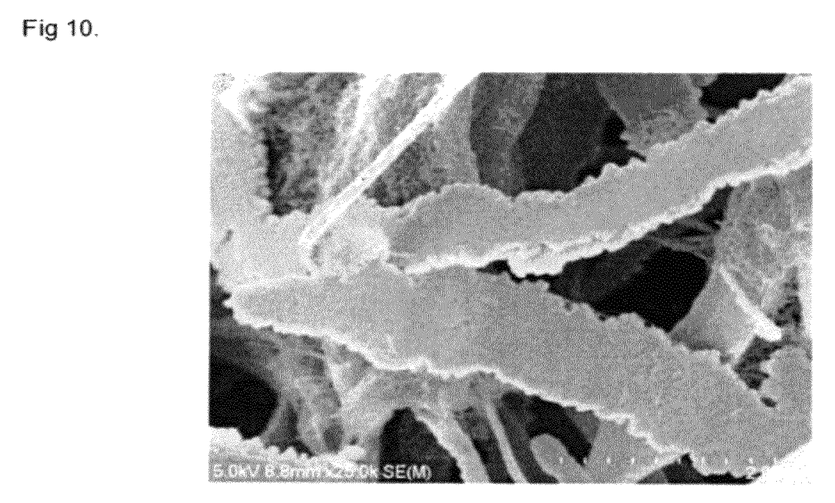
FIG. 10 shows an SEM image of the silver nanobelt obtained in Example 7.

Synthesis of Silver (Ag) Nanobelt 0.5 mg of silver nanobelt was obtained by the same method as Example 1, using the $P[Ani]_{0.5}[2\text{-aminophenol}]_{0.5}$ prepared in the Synthesis Example 7. SEM image of the obtained silver nanobelt is shown in FIG. 10. It is confirmed that the silver nanobelt has a belt shape with a length of 100~400 μl, a width of 0.4~1 μm, and a thickness of 50~200 nm (the length/width ratio is 10 or more, and the width/thickness ratio is 3 or more).

Example 8

Synthesis of Silver (Ag) Nanobelt

Figure 11:
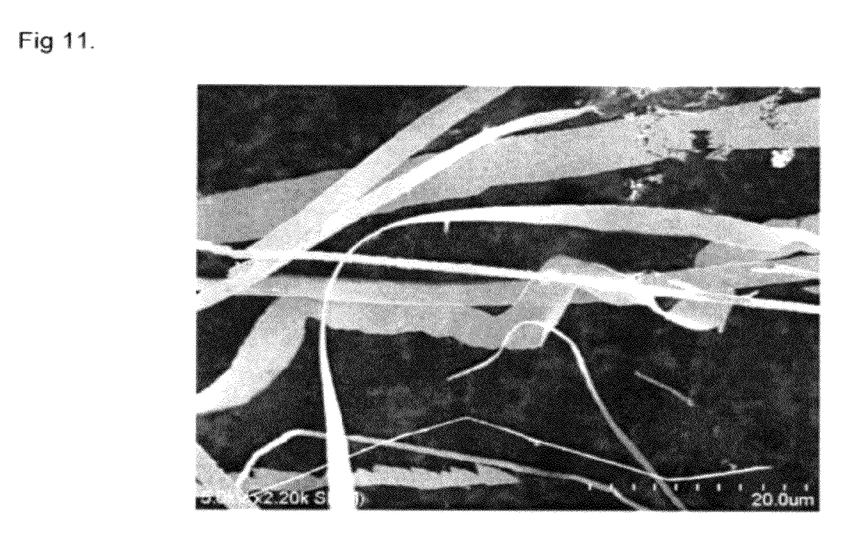
FIG. 11 shows an SEM image of the silver nanobelt obtained in Example 8.

Silver nanobelt was obtained by the same method as Example 1, using 120 mg of the P[Ani]$_{0.5}$[Anthranilic acid]$_{0.5}$ prepared in the Synthesis Example 4, except that the reaction time was 12 hours instead of 48 hours. The reaction mixture was centrifuged to remove unreacted silver ions. The mixture was washed with 30 ml of distilled water twice and with acetone once to obtain a solid phase mixture comprising MWNT, silver nanobelt, and some conductive polymer. SEM image of the obtained silver nanobelt mixture is shown in FIG. 11. It is confirmed that the silver nanobelt has a belt shape with a length of 50~300 μm, a width of 2~5 μm, and a thickness of 50~200 nm (provided that the length/width ratio is 10 or more, and the width/thickness ratio is 3 or more)

Example 9

Figure 12:
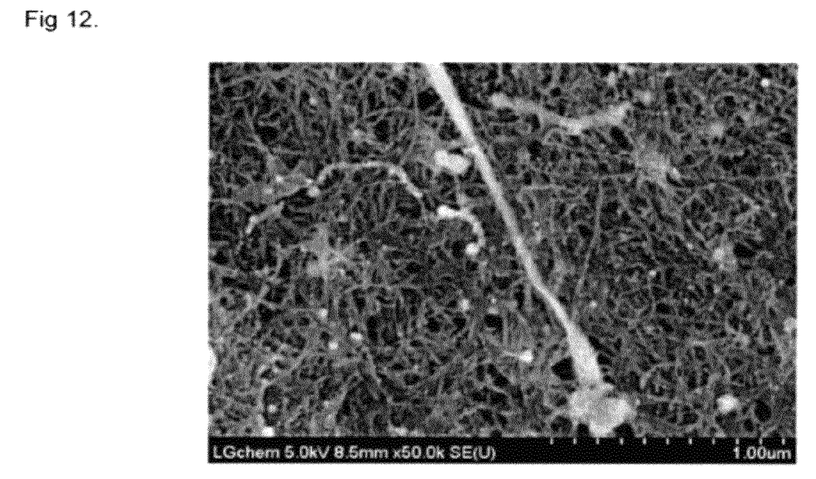
FIG. 12 shows an SEM image of the silver nanobelt obtained in Example 9.

Synthesis of Silver (Ag) Nanobelt 100 mg of multi walled carbon nanotube (MWNT) and 400 ml of distilled water were mixed, and ultrasonicated to form a MWNT dispersion. 150 mg of the polyaniline (P[Ani]$_{0.5}$ [Anthranilic acid]$_{0.5}$) powder prepared in the Synthesis Example 4 and 100 ml of ethanol were mixed, and ultrasonicated to form a polyaniline (PANi) dispersion. 300 ml of the MWNT dispersion and 100 ml of the PANni dispersion were mixed, and 35 mg of silver nitrate (AgNO$_3$) was added to form a mixed solution. 30 ml of ethanol in which 50 mg of ascorbic acid is dissolved was added to the solution, and the mixed solution was allowed to stand at 25° C. and 1 atm for 6 hours to progress a reaction. The reaction mixture was centrifuged to remove unreacted silver ions. The mixture was washed with 30 ml of distilled water twice and with acetone once to obtain a solid phase mixture comprising MWNT, silver nanobelt, and some conductive polymer. SEM image of the obtained silver nanobelt mixture is shown in FIG. 12. It is confirmed that the silver nanobelt has a belt shape with a length of 0.5~5 μm, a width of 50~150 nm, and a thickness of 20~30 nm (the length/width ratio is 10 or more, and the width/thickness ratio is 3 or more).

Example 10

Synthesis of Silver (Ag) Nanobelt

Figure 13:
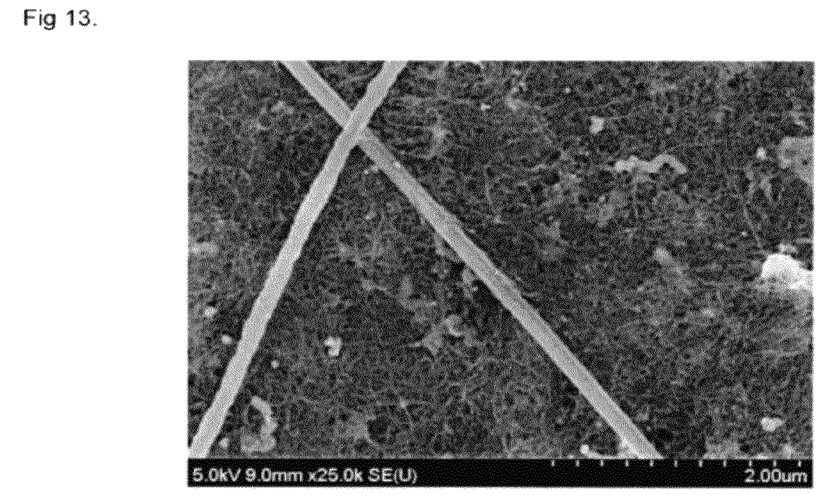
FIG. 13 shows an SEM image of the silver nanobelt obtained in Example 10.

Reaction was progressed by the same method as the Example 9, except that the mixed solution was allowed to stand at 4° C. for 12 hours. SEM image of the obtained silver nanobelt mixture is shown in FIG. 13. It is confirmed that the silver nanobelt has a belt shape with a length of 5~10 μm, a width of 100~200 nm, and a thickness of 20~50 nm (the length/width ratio is 10 or more, and the width/thickness ratio is 3 or more)

D. Manufacture of Transparent Conductive Film and Evaluation of Conductivity

Example 11

Preparation of a Conductive Ink Composition and a Transparent Conductive Film 10 mg of the silver nanobelt mixture obtained in the Example 10 and 30 ml of ethanol were mixed in 20 ml of DMF, and ultrasonicated to obtain a mixed dispersion of the silver nanobelt and MWNT, i.e., a conductive ink composition. The conductive ink composition was coated on a 10 cm×10 cm PET substrate, and dried at 120° C. to remove a solvent, thereby preparing a transparent conductive film.

Transmittance of the obtained transparent conductive film was measured using a UV/Vis spectrophotometer, and conductivity was measured by 4-probe method. As the results, it showed transmittance of 82%, and sheet resistance of 380 ohm/square. It is confirmed that in case a transparent conductive film is formed from the obtained silver nanobelt, a conductive film exhibiting excellent conductivity and transparency may be formed without progressing high temperature heating.

What is claimed is:

1. A method for manufacturing a metal nanobelt, wherein the method comprises:
   forming a first dispersion comprising a carbon nanotube, forming a second dispersion comprising a conductive polymer, and mixing the first and the second dispersions, and reacting the mixture with a metal salt at the temperature of 1° C. to room temperature,
   wherein the metal salt is a salt of silver (Ag).

2. The method of claim 1, wherein the conductive polymer is selected from the group consisting of polyaniline, polypyrrole, polythiophene, and a copolymer thereof.

3. The method of claim 1, wherein the salt of silver (Ag) is selected from the group consisting of silver sulfate (Ag$_2$SO$_4$), silver acetate (Ag(CH$_3$COO)), silver fluoride (AgF), silver chloride (AgCl), silver bromide (AgBr), silver iodide (AgI), silver cyanide (AgCN), silver cyanate (AgOCN), silver lactate (Ag(CH$_3$CHOHCOO)), silver carbonate (Ag$_2$CO$_3$), silver perchlorate (AgClO$_4$) and silver trifluoroacetate (Ag(CF$_3$COO)), silver trifluoromethanesulfonate (Ag(CF$_3$SO$_3$)), and a mixture thereof.

4. The method of claim 1, wherein the reaction of the metal salt, carbon nanotube, and conductive polymer is conducted in a solvent selected from water, alcohol, acetone, methylethylketone (MEK), ethylene glycol, formamide (HCOOH), dimethylformamide (DMF), dimethylacetamide (DMAc), dimethylsulfoxide (DMSO), N-methylpyrrolidone (NMP), or a mixed solvent thereof.

* * * * *